US010942363B2

(12) United States Patent
Daiku

(10) Patent No.: US 10,942,363 B2
(45) Date of Patent: Mar. 9, 2021

(54) LIQUID CRYSTAL DISPLAY DEVICE

(71) Applicant: TOPPAN PRINTING CO., LTD., Tokyo (JP)

(72) Inventor: Yasuhiro Daiku, Hino (JP)

(73) Assignee: TOPPAN PRINTING CO., LTD., Tokyo (JP)

(*) Notice: Subject to any disclaimer, the term of this patent is extended or adjusted under 35 U.S.C. 154(b) by 0 days.

(21) Appl. No.: 16/190,877

(22) Filed: Nov. 14, 2018

(65) Prior Publication Data

US 2019/0079309 A1 Mar. 14, 2019

Related U.S. Application Data

(63) Continuation of application No. PCT/JP2017/018215, filed on May 15, 2017.

(30) Foreign Application Priority Data

May 20, 2016 (JP) .............................. JP2016-101086

(51) Int. Cl.
*G02B 27/48* (2006.01)
*G02F 1/13357* (2006.01)
*F21V 8/00* (2006.01)
*G02F 1/1333* (2006.01)
(Continued)

(52) U.S. Cl.
CPC ........... *G02B 27/48* (2013.01); *G02B 6/0051* (2013.01); *G02B 6/0081* (2013.01);
(Continued)

(58) Field of Classification Search
None
See application file for complete search history.

(56) References Cited

U.S. PATENT DOCUMENTS

2010/0195022 A1 8/2010 Shikii et al.
2013/0258294 A1 10/2013 Kaneda et al.
2014/0125956 A1* 5/2014 Chifu ................... G02B 27/48
353/31

FOREIGN PATENT DOCUMENTS

CN 101743510 A 6/2010
JP 6-208089 7/1994
(Continued)

OTHER PUBLICATIONS

English Translation by WIPO of the International Preliminary Report on Patentability dated Nov. 29, 2018 in International Patent Application No. PCT/JP2017/018215, 6 pages.
(Continued)

*Primary Examiner* — Kenneth B Lee, Jr.

(57) ABSTRACT

According to one embodiment, a liquid crystal layer is provided between a first substrate and a second substrate. A switching element is provided on the first substrate. A pixel electrode is electrically connected to the switching element. A color filter is provided on a liquid crystal side of the second substrate and corresponds to the pixel electrode. A common electrode is provided on a liquid crystal side of the color filter. A light guide plate guides laser light incident on a side surface and emits the laser light from a main surface. A diffusion plate diffuses the laser light emitted from the light guide plate and applies the laser light to the first substrate. A supporting unit supports the diffusion plate. A vibration generation unit is provided in the supporting unit and vibrates the diffusion plate.

14 Claims, 8 Drawing Sheets

(51) Int. Cl.
   *H01L 41/09*   (2006.01)
   *G02F 1/1335*  (2006.01)
   *G02F 1/1368*  (2006.01)
   *H01L 41/08*   (2006.01)

(52) U.S. Cl.
   CPC .. *G02F 1/133308* (2013.01); *G02F 1/133615* (2013.01); *G02B 6/0038* (2013.01); *G02F 1/1368* (2013.01); *G02F 1/133514* (2013.01); *G02F 2001/133314* (2013.01); *G02F 2001/133317* (2013.01); *G02F 2201/121* (2013.01); *G02F 2201/123* (2013.01); *H01L 41/0805* (2013.01); *H01L 41/09* (2013.01); *H01L 41/0973* (2013.01)

(56) References Cited

FOREIGN PATENT DOCUMENTS

| JP | 2004-144936    | 5/2004  |   |         |
|----|----------------|---------|---|---------|
| JP | 2009-175636    | 8/2009  |   |         |
| JP | 2009175636 A   | *       |   | 8/2009  |
| JP | 2009-231017    | 10/2009 |   |         |
| JP | 2009231017 A   | *       |   | 10/2009 |
| JP | 2011-158542    | 8/2011  |   |         |
| JP | 2011-158543    | 8/2011  |   |         |
| JP | 2013-231940 A  | 11/2013 |   |         |

OTHER PUBLICATIONS

International Search Report dated Jul. 18, 2017 in corresponding International Application No. PCT/JP2017/018215.
Taiwanese Office Action dated Feb. 27, 2018 in corresponding Taiwanese Application No. 106116238.
Written Opinion of the International Searching Authority dated Jul. 18, 2017 in corresponding International Application No. PCT/JP2017/018215.
Office Action dated Jul. 28, 2020 in Japanese Patent Application No. 2016-101086.
First Office Action dated Nov. 19, 2020 in Chinese Patent Application No. 201780031252.2.

* cited by examiner

LIQUID CRYSTAL DISPLAY DEVICE

CROSS-REFERENCE TO RELATED APPLICATIONS

This application is a Continuation Application of PCT Application No. PCT/JP2017/018215, filed May 15, 2017, and based upon and claiming the benefit of priority from Japanese Patent Application No. 2016-101086, filed May 20, 2016, the entire contents of all of which are incorporated herein by reference.

FIELD

The present invention relates to a liquid crystal display device, for example, a liquid crystal display device using laser backlighting.

BACKGROUND

There is a limit to the color purity of a liquid crystal display device using a white LED and a color filter having broad spectral characteristics. Accordingly, when further increasing the color purity, it is effective to use laser backlighting with red (R), green (G), and blue (B) laser lights having peak spectral characteristics as illumination lights of a liquid crystal display panel. However, when laser light is used as illumination light, speckle noise (a spot pattern generated when light with good coherence like a laser passes through an object or is scattered by the object) appears, and degrades the original display performance in a liquid crystal display panel. As a method for solving this problem, there are a method (for example, Jpn. Pat. Appln. KOKAI Publication No. 2011-158543) in which an optical low-pass filter is sandwiched in the middle of an optical path, and a method in which a diffusion plate is vibrated within a plane in a liquid crystal projector (for example, Jpn. Pat. Appln. KOKAI Publication No. 2011-158542).

SUMMARY

A liquid crystal display device according to an aspect of the present invention comprises: a first substrate; a second substrate arranged on the first substrate; a liquid crystal layer provided between the first substrate and the second substrate; a switching element provided on the first substrate; a pixel electrode electrically connected to the switching element; a color filter provided on a liquid crystal side of the second substrate and that corresponds to the pixel electrode; a common electrode provided on a liquid crystal side of the color filter; a light guide plate including a side surface and a main surface, guiding laser light incident on the side surface, and emitting the laser light from the main surface; a diffusion plate that diffuses the laser light emitted from the light guide plate, and applies the laser light to the first substrate; a supporting unit that supports the diffusion plate; and a vibration generation unit provided in the supporting unit and that vibrates the diffusion plate.

DETAILED DESCRIPTION

Figure 1:
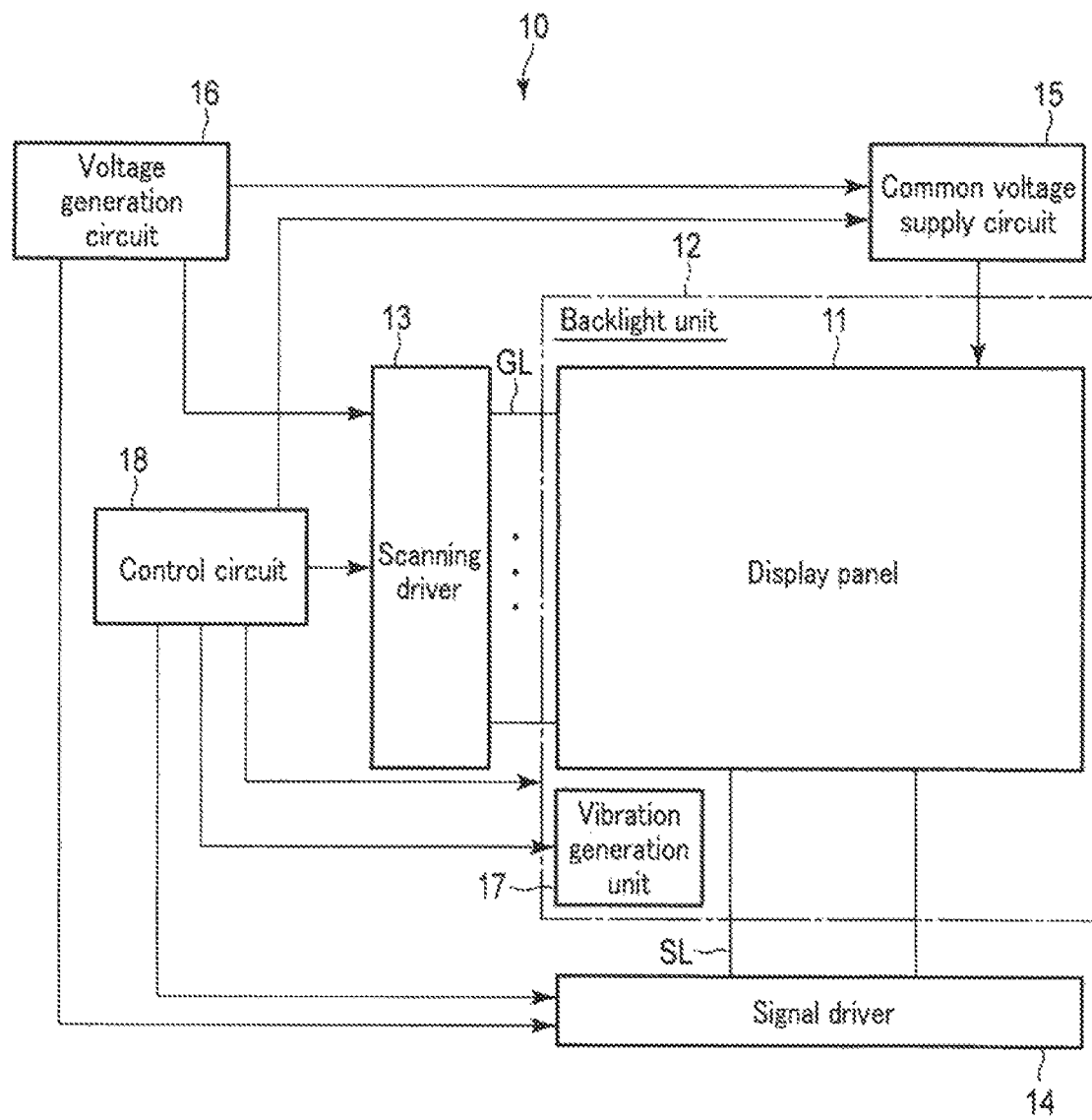
FIG. 1 is a block diagram showing a circuit configuration of a liquid crystal display device of a first embodiment.

Hereinafter, embodiments will be described with reference to the drawings. However, it should be noted that the drawings are schematic or conceptual, and the dimensions and ratios of the drawings are not necessarily the same as the actual ones. In addition, even when the same parts are shown in the drawings, they may be illustrated differently in relationship and ratio of their dimensions from one another. In particular, some embodiments described below exemplify apparatuses for embodying the technical idea of the present invention, and the technical idea of the present invention is not specified by the shape, structure, arrangement, etc. of constituent components. In the following description, elements having the same functions and configurations are denoted by the same reference numerals, and redundant explanations are given only when necessary.

[1] First Embodiment

Hereinafter, a liquid crystal display device of a first embodiment will be described.

[1-1] Configuration of Liquid Crystal Display Device

FIG. 1 is a block diagram showing a circuit configuration of a liquid crystal display device 10 according to the first embodiment of the present invention. The liquid crystal display device 10 includes a display panel 11, a backlight unit (supporting unit) 12, a scanning driver (scanning line driving circuit) 13, a signal driver (signal line driving circuit) 14, a common voltage supply circuit 15, a voltage generation circuit 16, a vibration generation unit, for example, a vibration motor 17, and a control circuit 18.

The display panel 11 includes a pixel array in which a plurality of pixels are arranged in a matrix. The display panel 11 is provided with a plurality of scanning lines GL each extending in a row direction (X direction) and a plurality of signal lines SL each extending in a column direction (Y direction). Pixels are arranged in intersection regions of the scanning lines GL and the signal lines SL.

The backlight unit 12 is a unit that irradiates a back surface of the display panel 11 with light. As the backlight unit 12, for example, a laser backlight that applies a laser light made incident on a side surface from a main surface to the display panel 11, as a planar light, is used. The backlight unit 12 will be described later in detail.

The scanning driver 13 is connected to the plurality of scanning lines GL. Based on a vertical control signal sent from the control circuit 18, the scanning driver 13 sends to the display panel 11 a scanning signal for turning on/off a switching element included in the pixel.

The signal driver 14 is connected to the plurality of signal lines SL. The signal driver 14 receives a horizontal control signal and display data from the control circuit 18. Based on the horizontal control signal, the signal driver 14 sends a gradation signal (driving voltage) corresponding to display data to the display panel 11.

The common voltage supply circuit 15 generates a common voltage Vcom, and supplies it to the display panel 11. The voltage generation circuit 16 generates various voltages necessary for an operation of the liquid crystal display device 10, and supplies them to respective circuits.

The vibration motor 17 is provided in the backlight unit 12, and vibrates the diffusion plate in the backlight unit 12. The vibration motor 17 will be described later in detail.

The control circuit 18 receives image data from the outside. The control circuit 18 sends various control signals to respective circuits based on the image data. Then, the control circuit 18 controls display on the display panel 11 by various control signals, and controls generation of vibration by the vibration motor 17.

[1-1-1] Configuration of Display Panel and Backlight Unit

Figure 2:
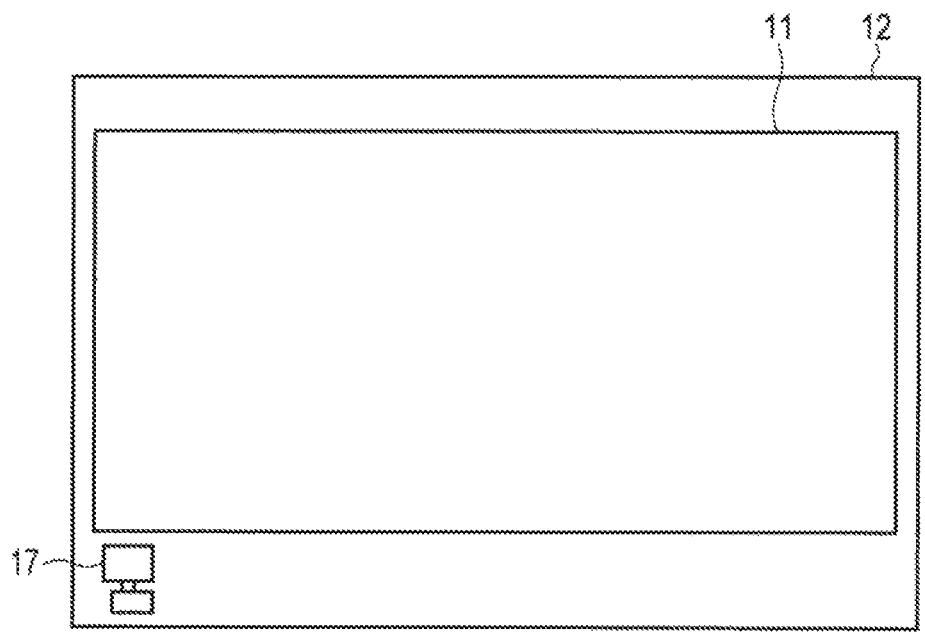
FIG. 2 is a plan view of a display panel and a backlight unit in the liquid crystal display device of the first embodiment.

Next, configurations of the display panel 11 and the backlight unit 12 will be described. FIG. 2 is a plan view of the display panel 11 and the backlight unit 12, and FIG. 3 is a cross-sectional view thereof.

Figure 3:
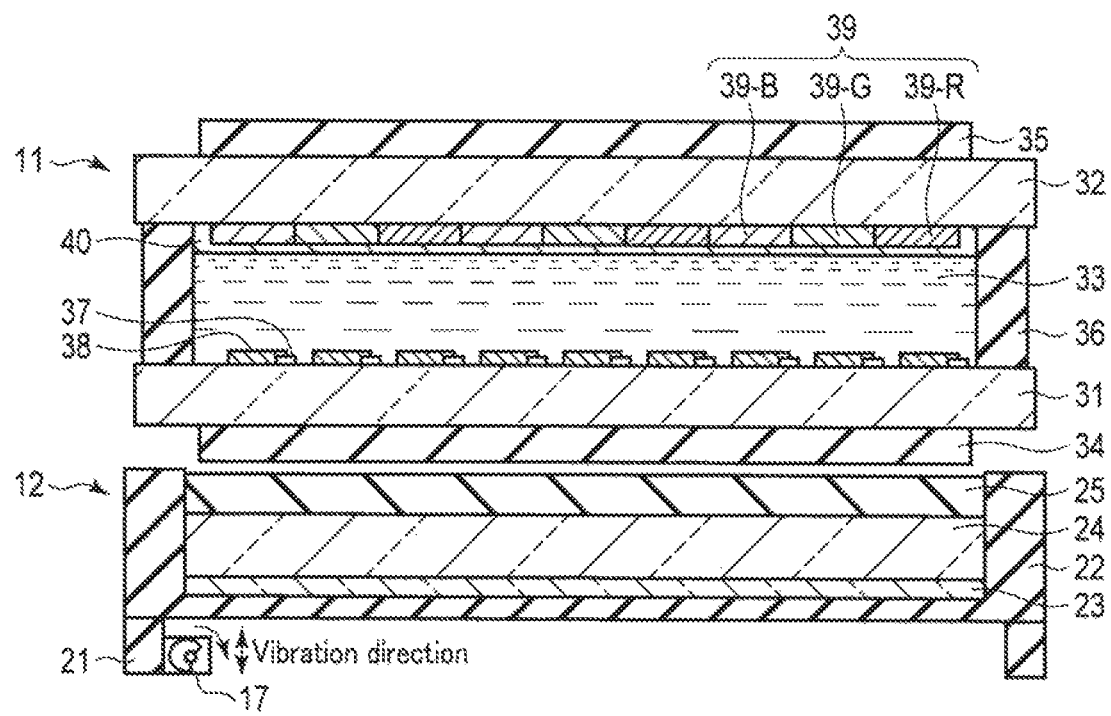
FIG. 3 is a cross-sectional view showing a configuration of the liquid crystal display device of the first embodiment.

As shown in FIGS. 2 and 3, the display panel 11 is arranged on the backlight unit 12, and the display panel 11 is irradiated with laser light emitted from the backlight unit 12.

The backlight unit 12 includes a backlight base 21, a backlight case 22, a reflection plate (or a reflection film) 23, a light guide plate 24, and a diffusion plate (or diffusion film) 25.

The backlight case 22 is fixed to the backlight base 21. In the backlight case 22, the reflection plate 23, the light guide plate 24, and the diffusion plate 25 are arranged in order. To the backlight base 21, the vibration generation unit, for example the vibration motor 17, is attached. In detail, the backlight base 21 includes a mounting surface (a first surface) in a direction crossing (for example, orthogonal to) a main surface of the diffusion plate 25. The vibration motor 17 is mounted on this mounting surface of the backlight base 21.

The vibration motor 17 includes a rotation axis with a vibrator, and generates vibration by rotation of the rotation axis. When the rotation axis of the vibration motor 17 rotates, the vibrator provided on the rotation axis rotates, and the vibration motor 17 mainly vibrates in a direction parallel to the mounting surface.

Vibration generated from the vibration motor 17 propagates to the backlight base 21 and the backlight case 22. The vibration propagated to the backlight case 22 propagates to the diffusion plate 25. In detail, due to the vibration of the vibration motor 17, the backlight base 21 and the backlight case 22 vibrate mainly in a direction parallel to the mounting surface, in other words, in a direction crossing the main surface of the diffusion plate 25. Furthermore, due to the vibration of the backlight case 22, the diffusion plate 25 vibrates mainly in a direction crossing the main surface of the diffusion plate 25.

The display panel 11 includes a TFT substrate 31 on which TFTs (Thin Film Transistors), pixel electrodes, etc. are formed, a color filter substrate (CF (Color Filter) substrate) 32 in which a color filter, a common electrode, etc. are formed and arranged opposite to the TFT substrate 31, and a liquid crystal layer 33 sandwiched between the TFT substrate 31 and the CF substrate 32.

Each of the TFT substrate 31 and the CF substrate 32 is constituted of a transparent substrate (for example, a glass substrate). A polarizing plate 34 is arranged on a surface of the TFT substrate 31, which is opposite to the liquid crystal layer 33. Furthermore, a polarizing plate 35 is arranged on a surface of the CF substrate 32, which is opposite to the liquid crystal layer 33.

The TFT substrate 31 is arranged to face the backlight unit 12. Illumination light irradiated from the backlight unit 12 (diffusion plate 25) is incident on the display panel 11 from the TFT substrate 31 side. The surface of the CF substrate 32, which is opposite to the backlight unit 12, is a display surface of the display panel 11.

The TFT substrate 31 and the CF substrate 32 are bonded with a seal member 36 while maintaining a space. A liquid crystal material is sealed in the space surrounded by the TFT substrate 31, the CF substrate 32, and the seal member 36 to form the liquid crystal layer 33.

In the liquid crystal material included in the liquid crystal layer 33, in accordance with an electric field applied between the TFT substrate 31 and the CF substrate 32, alignment of liquid crystal molecules is manipulated, and optical characteristics change. In addition, the liquid crystal layer 33 is composed of a liquid crystal layer including liquid crystal molecules having dielectric anisotropy, for example, a nematic liquid crystal. In nematic liquid crystal molecules, electric polarization occurs according to an external electric field. As a liquid crystal mode, for example, a VA (Vertical Alignment) mode is used. However, other liquid crystal modes, such as a TN (Twisted Nematic) mode and a homogeneous mode, may of course be used.

On the liquid crystal layer 33 side of the TFT substrate 31, a plurality of switching elements, for example, the aforementioned TFTs (Thin Film Transistors) 37, are provided. The TFT 37 includes a gate electrode electrically connected to the scanning line GL, a gate insulating film provided over the gate electrode, a semiconductor layer (for example, an amorphous silicon layer) provided over the gate insulating film, and a source electrode and a drain electrode provided to be spaced apart from each other on the semiconductor layer. The source electrode is electrically connected to the signal line SL. An insulating layer (not shown) is provided on the TFT 37. On the insulating layer, a plurality of pixel electrodes 38 are provided.

On the liquid crystal layer 33 side of the CF substrate 32, a color filter 39 is provided. The color filter 39 includes a plurality of coloring filters (coloring members). Specifically, the color filter 39 includes a plurality of red filters 39-R, a plurality of green filters 39-G, and a plurality of blue filters 39-B. A general color filter is composed of red (R), green (G), and blue (B), which are the three primary colors of light. A set of three adjacent colors R, G, and B is a unit of display (pixel). A single monochrome portion of R, G, or B within one pixel is a minimum driving unit, called a subpixel. The TFT 37 and the pixel electrode 38 are provided for each subpixel. In the following description, it is assumed that a subpixel is referred to as a pixel unless a distinction between a pixel and a subpixel is particularly necessary.

A light shielding black matrix (light shielding film) (not shown) is provided at boundary portions between the red filter 39-R, the green filter 39-G, and the blue filter 39-B, and at boundary portions between the pixels (subpixels). That is, the black matrix is formed in a mesh shape. The black matrix is provided, for example, for shielding unnecessary light between the coloring members to improve the contrast.

A common electrode 40 is provided on the color filter 39 and the black matrix. The common electrode 40 is formed in a planar shape over an entire display area of the display panel 11.

The polarizing plates 34 and 35 are provided so as to sandwich the TFT substrate 31 and the CF substrate 32. The polarizing plates 34, 35 each are composed of a linear polarizer and a ¼ wavelength plate.

The pixel electrode 38 and the common electrode 40 are composed of transparent electrodes, and, for example, ITO (indium tin oxide) is used.

[1-1-2] Configuration of Pixels

Figure 4:
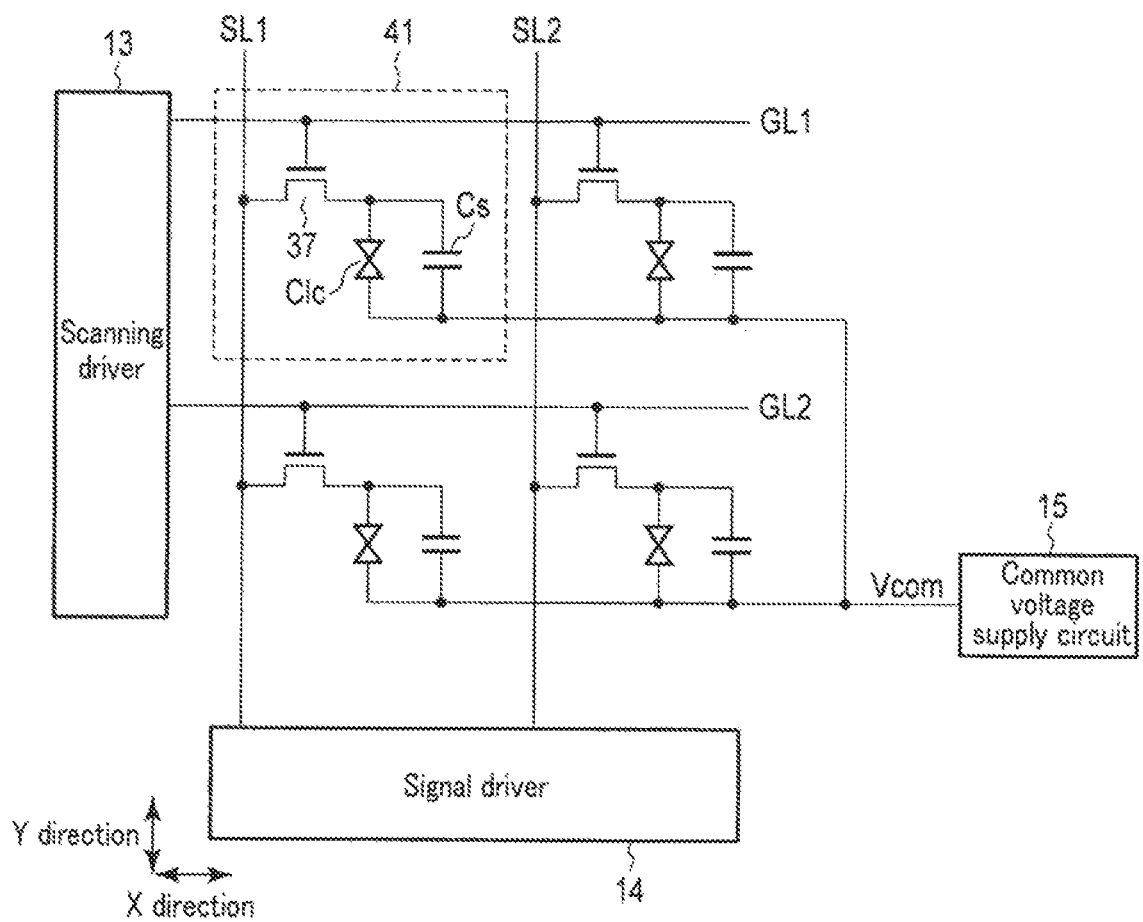
FIG. 4 is a circuit diagram of pixels in the display panel in the liquid crystal display device of the first embodiment.

Next, a configuration of the pixels included in the display panel 11 will be described. FIG. 4 is a circuit diagram of the pixels in the display panel 11. In FIG. 4, four pixels are extracted and shown.

A pixel 41 includes the TFT 37, a liquid crystal capacitance (liquid crystal element) Clc, and a storage capacitance Cs. As the TFT 37, for example, an n-channel TFT is used.

A source of the TFT 37 is electrically connected to the signal line SL (SL 1, SL 2). A gate of the TFT 37 is electrically connected to the scanning line GL (GL 1, GL 2). A drain of the TFT 37 is electrically connected to the liquid crystal capacitance Clc. The liquid crystal capacitance Clc as a liquid crystal element is constituted of a pixel electrode, a common electrode, and a liquid crystal layer sandwiched therebetween.

The storage capacitance Cs is connected in parallel to the liquid crystal capacitance Clc. The storage capacitance Cs has a function of suppressing a potential fluctuation occurring in the pixel electrode 38 and maintaining a driving voltage applied to the pixel electrode 38 until a driving voltage corresponding to the next signal is applied. The storage capacitance Cs is constituted of the pixel electrode 38, a storage electrode (storage capacitance line) (not shown), and an insulating film sandwiched therebetween. A common voltage Vcom is applied to the common electrode and the storage electrode by the common voltage supply circuit 15.

[1-1-3] Configurations of Backlight Unit and Laser Light Source

Figure 5:
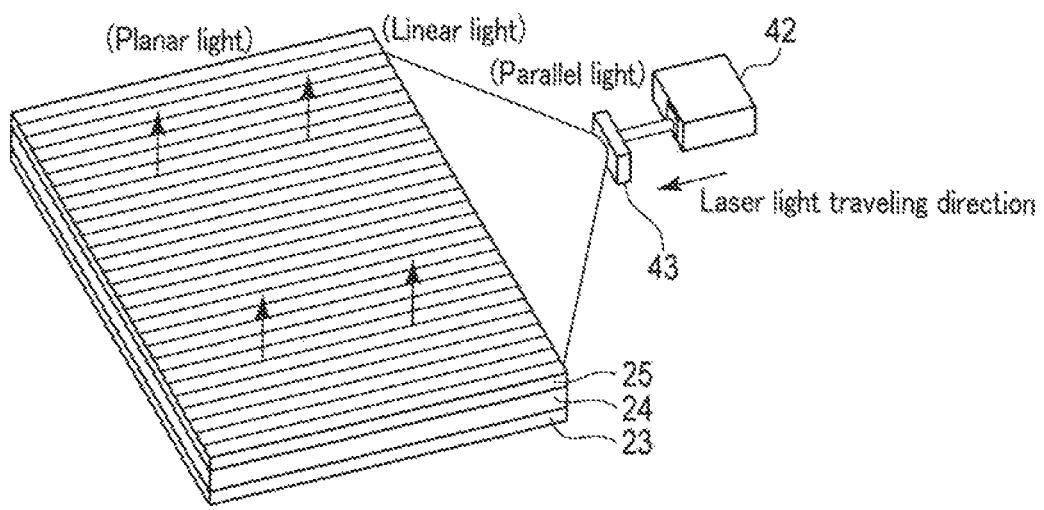
FIG. 5 is a perspective view showing a configuration of the backlight unit and a laser light source in the liquid crystal display device of the first embodiment.

Next, configurations of the reflection film 23, the light guide plate 24, and the diffusion plate 25 in the backlight unit 12, and a laser light source for emitting the laser light to the light guide plate 24 will be described. FIG. 5 is a perspective view showing a configuration of the backlight unit 12 and the laser light source in the liquid crystal display device 10.

On an optical path of the laser light of a laser light source 42, a lenticular lens 43 and the light guide plate 24 are arranged in order. The parallel laser light emitted from the laser light source 42 passes through the lenticular lens 43 to become linear light, spreads in a fan shape, and is incident on a side surface of the light guide plate 24. The laser light incident on the light guide plate is reflected in the main surface direction within the light guide plate 24 to become planar light, and irradiates the display panel 11 as illumination light.

[1-2] Operation of Liquid Crystal Display Device

The control circuit 18 controls a display state on the display panel 11. The control circuit 18 drives the scanning line GL and the signal line SL through the scanning driver 113 and the signal driver 14, respectively to control whether or not to apply a voltage to the liquid crystal layer 33 between the pixel electrode 38 and the common electrode 40. Thereby, an image on the display panel 11 will be displayed or will not be displayed.

When displaying an image on the display panel 11, the control circuit 18 drives the vibration motor 17 along with the display of the image. On the other hand, when the image of the display panel 11 is not displayed, the vibration motor 17 is not driven along with the non-display of the image.

As described above, the vibration motor 17 is mounted on a part of the backlight unit 12 (backlight base 21). The vibration motor 17 generates vibration as the display of the display panel 11 is turned on by the control of the control circuit 18 to cause the backlight unit 12 to vibrate. When the backlight unit 12 vibrates, the vibration propagates to the diffusion plate 25, and the diffusion plate 25 vibrates. Herein, the backlight unit 12 includes the mounting surface parallel to the direction crossing the main surface of the diffusion plate 25, and the vibration motor 17 is mounted on this mounting surface. Thus, the vibration motor 17 vibrates the backlight unit 12 mainly in a direction parallel to the mounting surface, that is, in the direction crossing the main surface of the diffusion plate 25. Thereby, the diffusion plate 25 vibrates mainly in the direction crossing the main surface thereof.

[1-3] Modification

Next, a modification of the first embodiment will be described. In the first embodiment, the reflection film 23, the light guide plate 24, and the diffusion plate 25 are supported by the backlight case 22, but this modification indicates an example in which a member supporting the diffusion plate 25 is separated from members supporting the others. A circuit configuration and a liquid crystal panel in the modification are the same as those of the first embodiment. Hereinafter, points different from the first embodiment will be described.

[1-3-1] Configuration of Backlight Unit

Figure 6:
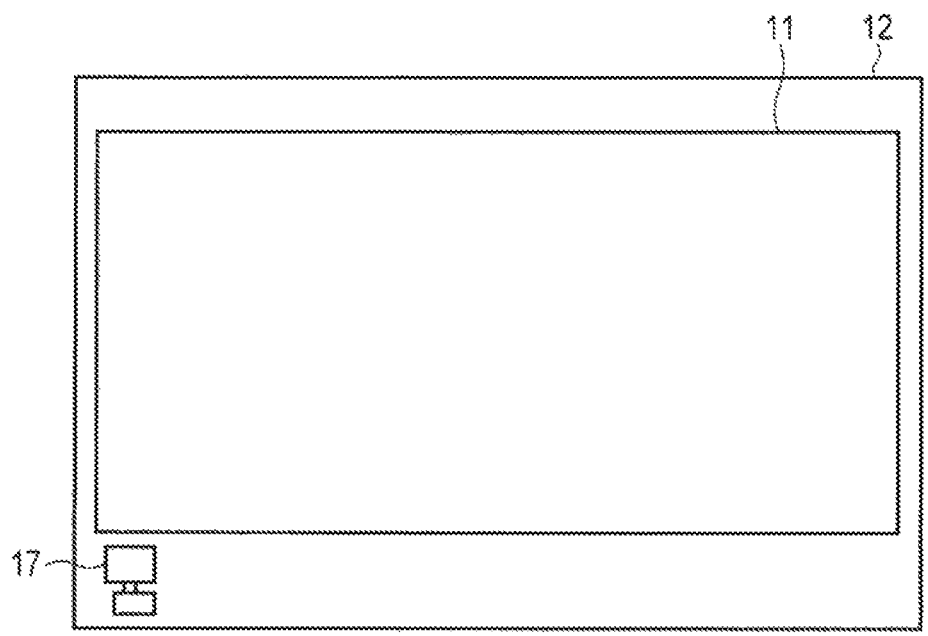
FIG. 6 is a plan view of a display panel and a backlight unit in a liquid crystal display device of a modification of the first embodiment.

A configuration of the backlight unit in the modification will be described. FIG. 6 is a plan view of the display panel 11 and the backlight unit of the modification, and FIG. 7 is a cross-sectional view thereof.

Figure 7:
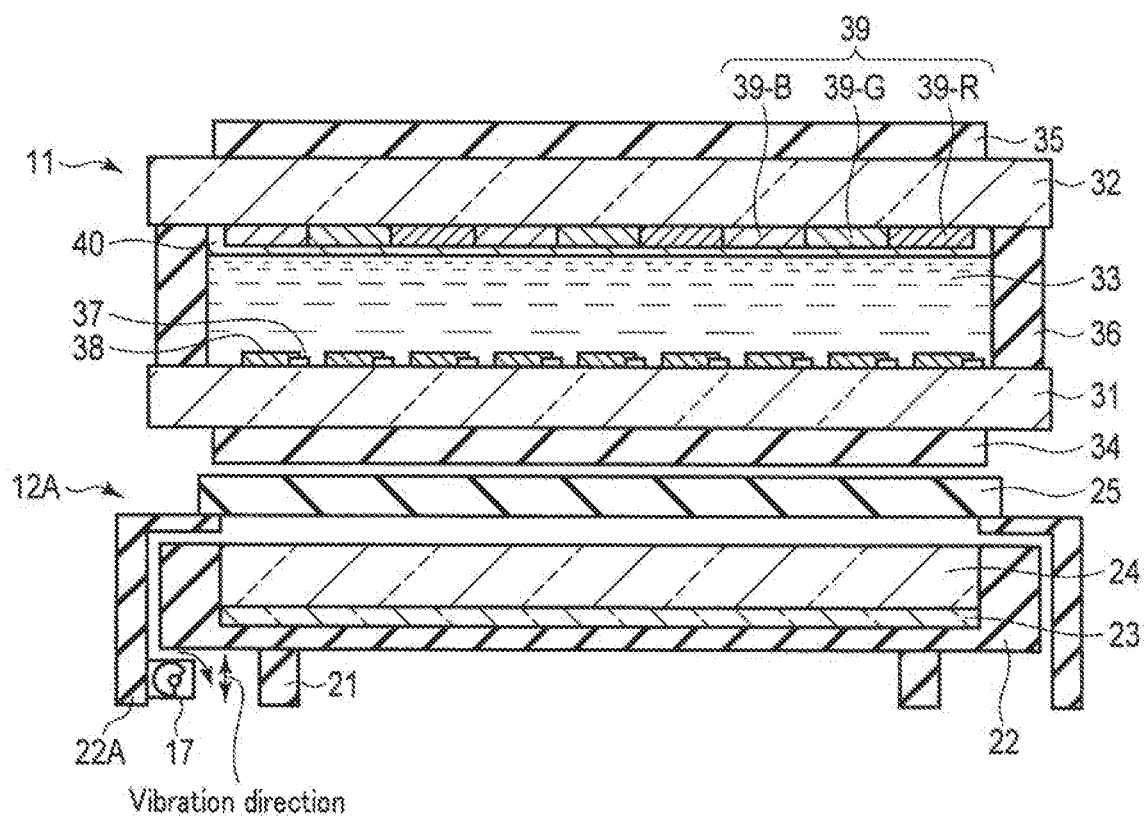
FIG. 7 is a cross-sectional view showing a configuration of the liquid crystal display device of the modification of the first embodiment.

As shown in FIG. 7, the backlight unit 12A includes a first supporting member constituted of the backlight base 21, the backlight case 22, the reflection film 23, and the light guide plate 24, and a second supporting member 22A that supports the diffusion plate 25.

The first supporting member is configured as follows. The backlight case 22 is provided on the backlight base 21. In the backlight case 22, the reflection film 23 and the light guide plate 24 are arranged in order.

The second supporting member 22A is configured as follows. The diffusion plate 25 is supported by the second supporting member 22A. The diffusion plate 25 supported by the second supporting member 22A is arranged above the light guide plate 24 of the backlight case 22. The second supporting member 22A includes the mounting surface of the direction crossing (e.g., orthogonal to) the main surface of the diffusion plate 25. The vibration motor 17 is mounted on this mounting surface.

When the rotation axis of the vibration motor 17 rotates, the vibrator provided on the rotation axis rotates, and the vibration motor 17 mainly vibrates in the direction parallel to the mounting surface. Vibration generated from the vibration motor 17 propagates to the second supporting member 22A. Furthermore, the vibration propagated to the second supporting member 22A propagates to the diffusion plate 25. That is, due to the vibration of the vibration motor 17, the second supporting member 22A mainly vibrates in the direction parallel to the mounting surface, in other words, in the direction crossing the main surface of the diffusion plate 25. Due to the vibration of the second supporting member 22A, the diffusion plate 25 vibrates mainly in the direction crossing the main surface of the diffusion plate 25.

[1-4] Effect of First Embodiment

According to the liquid crystal display devices of the present embodiment and the modification, it is possible to reduce speckle noise generated when laser light is used as illumination light, and to improve display performance.

Hereinafter, effects of the present embodiment and the modification will be described in detail.

As described above, when a laser backlight is used to increase the color purity of a liquid crystal display device, speckle noise of laser light appears, sometimes lowering the display performance of the display panel 11.

Accordingly, in the present embodiment and the modification, the diffusion plate 25 that emits laser light as illumination light is vibrated in a direction crossing a main surface of the diffusion plate 25 (or in an optical path direction of the laser light). That is, as described above, a supporting unit (backlight unit 12) supporting the diffusion plate 25 includes a mounting surface parallel to the direction crossing (for example, orthogonal to) the main surface of the diffusion plate 25, and a vibration generation unit, for example, the vibration motor 17, is mounted on this mounting surface. Vibration generated from the vibration motor 17 propagates to the diffusion plate 25 via the supporting unit (the backlight base 21, the backlight case 22, the second supporting member 22A) or the light guide plate 24. Thus, the diffusion plate 25 mainly vibrates in the direction crossing its main surface, for example, in a direction orthogonal to the main surface. As a result, by disturbing scattering of the laser light emitted from the diffusion plate 25, a spot pattern called speckle noise generated due to interference of the laser light can be reduced.

In addition, in the present embodiment and the modification, since it is not necessary to add a filter to the optical path of the laser light, an increase in product cost can be suppressed. Since the diffusion plate 25 is vibrated by vibrating the backlight unit 12, accuracy of vertical and horizontal spaces in the diffusion plate 25 would not be reduced.

Figure 8:
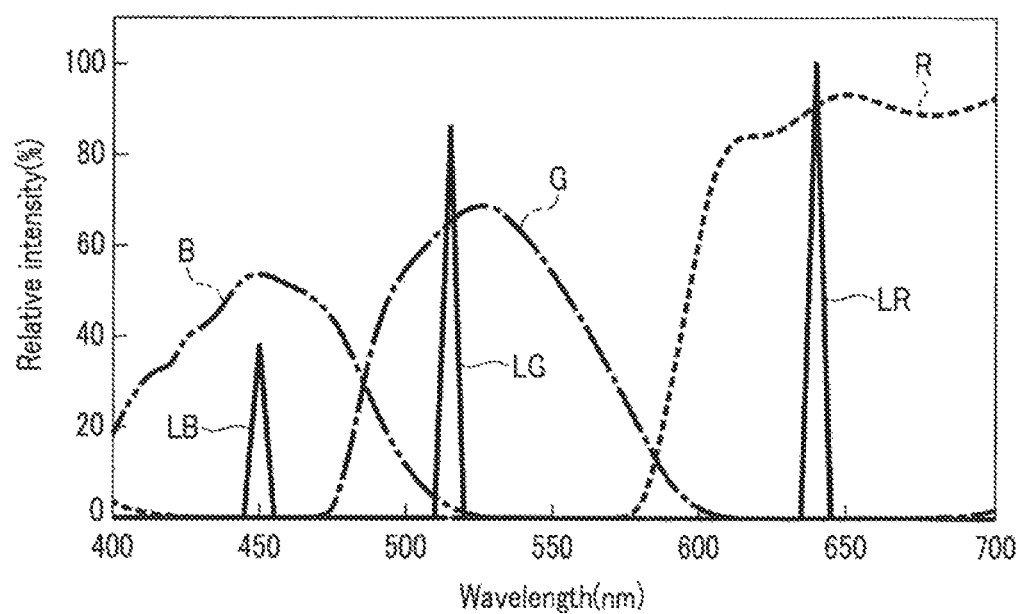
FIG. 8 is a diagram showing spectral characteristics of laser light and a color filter in the liquid crystal display device of the first embodiment.
Figure 9:
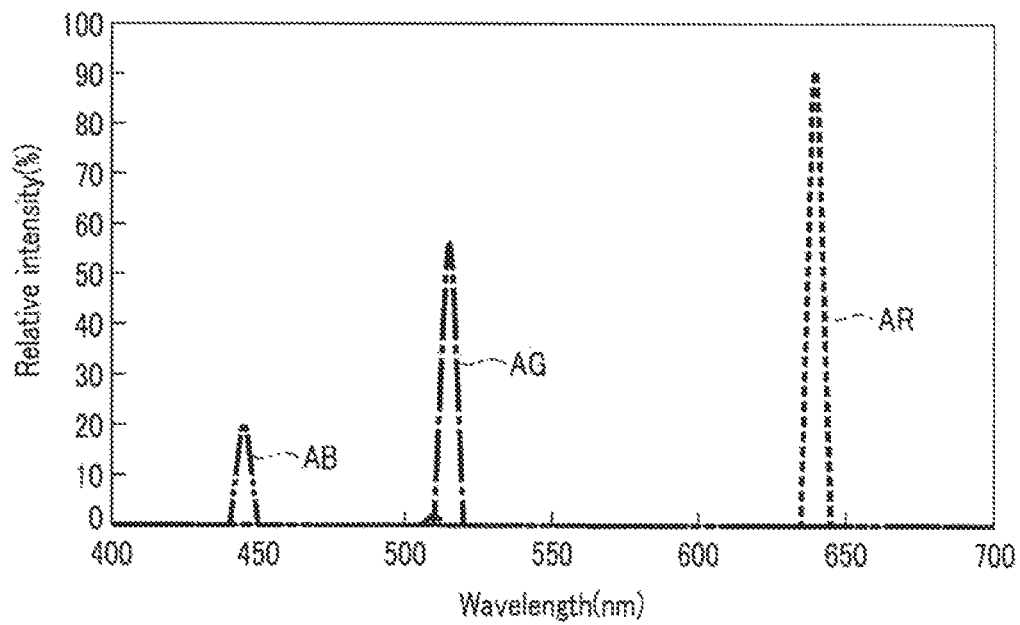
FIG. 9 is a diagram showing spectral characteristics obtained by combining the laser light and the color filter shown in FIG. 8.

FIG. 8 shows the spectral characteristics of the laser light and the color filter in the present embodiment and the modification. The horizontal axis indicates wavelength of light, and the vertical axis indicates relative intensity, for example, light intensity when the maximum value of red laser light used here is 100%. Spectral characteristics of a red laser LR, a green laser LG, a blue laser LB as laser light, and those of a red filter R, a green filter G, a blue filter B as color filters are shown. FIG. 9 shows spectral characteristics AR, AG, and AB obtained by combining the laser lights and the color filters shown in FIG. 8. That is, the spectral characteristic AR is obtained by multiplying the light intensities of the red laser LR and the red filter R shown in FIG. 8. The spectral characteristic AG is obtained by multiplying the light intensities of the green laser LG and the green filter G shown in FIG. 8. Furthermore, the spectral characteristic AB is obtained by multiplying the light intensities of the blue laser LB and the blue filter B shown in FIG. 8. As can be seen from FIG. 9, according to the present embodiment and the modification, the color purity of display in the liquid crystal display device 10 can be enhanced.

[2] Second Embodiment

Next, a liquid crystal display device of a second embodiment will be described. In the second embodiment, an example in which a diffusion plate is vibrated by using a piezo film will be described. In the second embodiment, mainly points different from the first embodiment will be described.

[2-1] Configurations of Display Panel and Backlight Unit

Figure 10:
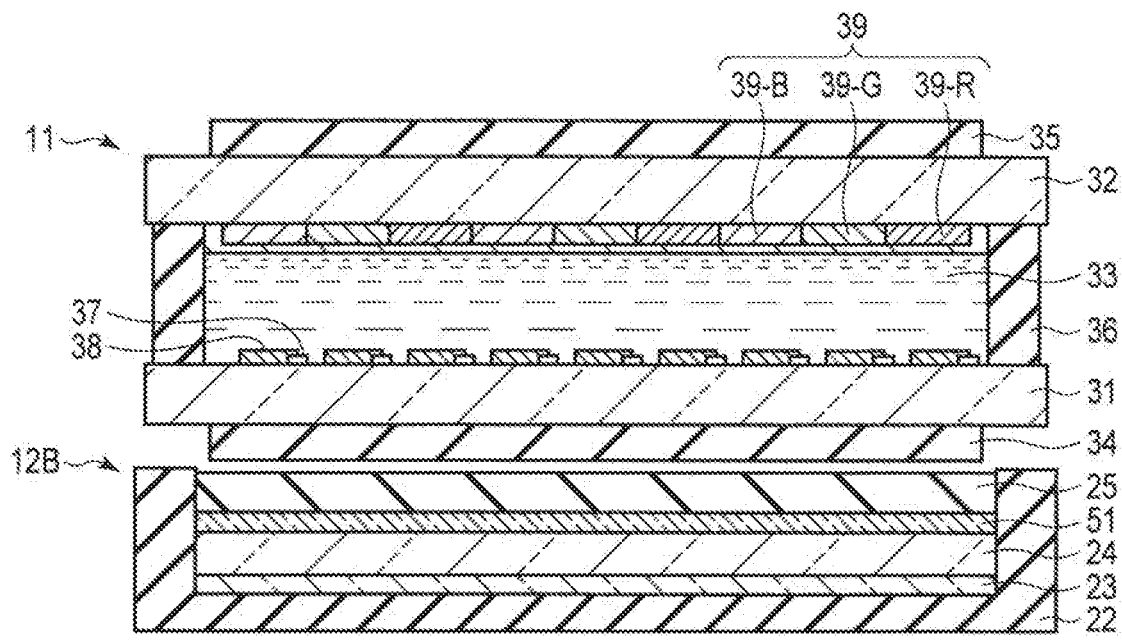
FIG. 10 is a cross-sectional view showing a configuration of a liquid crystal display device of a second embodiment.
Figure 11:
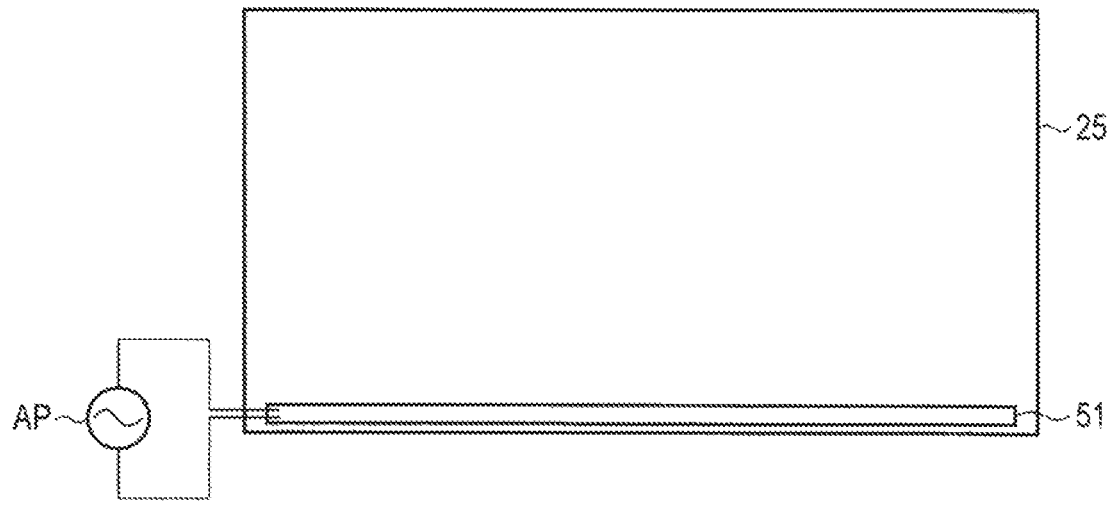
FIG. 11 is a plan view showing a positional relationship between a diffusion plate and a piezo film of a backlight unit in the second embodiment.

FIG. 10 is a cross-sectional view of the display panel and a backlight unit 12B in the second embodiment. FIG. 11 is a plan view showing a positional relationship between the diffusion plate 25 and the piezo film in the backlight unit 12B.

The backlight unit 12B is configured as follows. As shown in FIG. 10, the reflection plate 23, the light guide plate 24, the vibration generation unit, for example, a piezo film 51, and the diffusion plate 25 are arranged in this order on the backlight case 22. That is, in the backlight case 22, the piezo film 51 is provided between the light guide plate 24 and the diffusion plate 25. As shown in FIG. 11, the piezo film 51 is arranged so as to overlap and contact a part of the diffusion plate 25.

The piezo film 51 is a film including a piezoelectric element. For example, when an AC voltage of 60 Hz is applied to the piezo film 51 by an AC power supply AP, displacement occurs in the piezoelectric element. Due to this displacement occurring in the piezoelectric element of the piezo film 51, the diffusion plate 25 vibrates mainly in a direction crossing its main surface, for example, in a direction orthogonal to the main surface. The piezo film 51 is made of a transparent material. When the piezo film 51 is arranged outside a display area of the display panel 11, it may be opaque.

Figure 12:
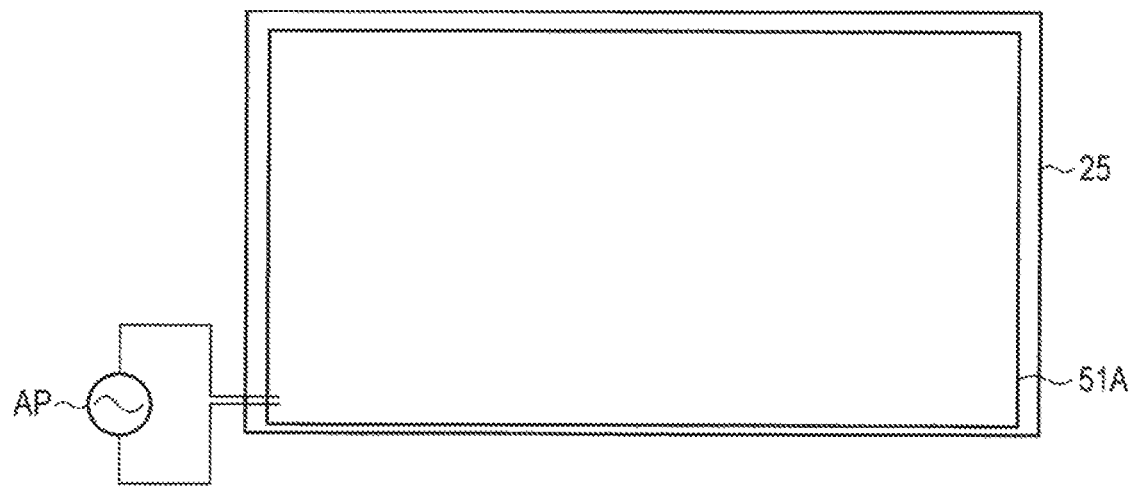
FIG. 12 is a plan view showing another example of the positional relationship between the diffusion plate and the piezo film of the backlight unit in the second embodiment.

FIG. 11 shows an example in which the piezo film 51 is arranged on a part of the main surface of the diffusion plate 25, but the present invention is not limited thereto. As shown in FIG. 12, a piezo film 51A may be arranged on the main surface of the diffusion plate 25 almost entirely.

[2-2] Operation of Liquid Crystal Display Device

When displaying an image on the display panel 11, the control circuit 18 drives the piezo film 51 along with the display of the image. On the other hand, when the image of the display panel 11 is not displayed, the piezo film 51 is not driven along with the non-display of the image.

As described above, the piezo film 51 is arranged between the light guide plate 24 and the diffusion plate 25 of the backlight unit 12B. As the display of the display panel 11 is turned on by the control of the control circuit 18, the piezo film 51 generates vibration to vibrate the diffusion plate 25. Thus, the diffusion plate 25 vibrates mainly in the direction crossing its main surface.

[2-3] Effect of Second Embodiment

According to the liquid crystal display device of the present embodiment, it is possible to reduce speckle noise generated when laser light is used as illumination light, and to improve display performance.

Hereinafter, an effect of the present embodiment will be described in detail.

In the present embodiment, the diffusion plate 25 that emits laser light as illumination light is vibrated mainly in the direction crossing a main surface of the diffusion plate 25 (or in an optical path direction of the laser light) by the piezo film 51. That is, as described above, the piezo film 51 is arranged between the light guide plate 24 and the diffusion plate 25. Vibration generated from the piezo film 51 propagates to the diffusion plate 25. Thus, the diffusion plate 25 vibrates mainly in the direction crossing its main surface, for example, in a direction orthogonal to the main surface. As a result, by disturbing scattering of the laser light emitted from the diffusion plate 25, it is possible to reduce speckle noise generated due to interference of the laser light.

In addition, in the present embodiment, it is possible to mainly vibrate only the diffusion plate 25. Thus, the present embodiment can also be applied to, for example, a case where a problem occurs due to vibration of a member other than the diffusion plate 25.

[3] Third Embodiment

Next, the liquid crystal display device of a third embodiment will be described. The third embodiment will describe another example of vibrating a diffusion plate using a piezo film. In the third embodiment, mainly points different from the first and second embodiments will be described.

[3-1] Configuration of Display Panel and Backlight Unit

Figure 13:
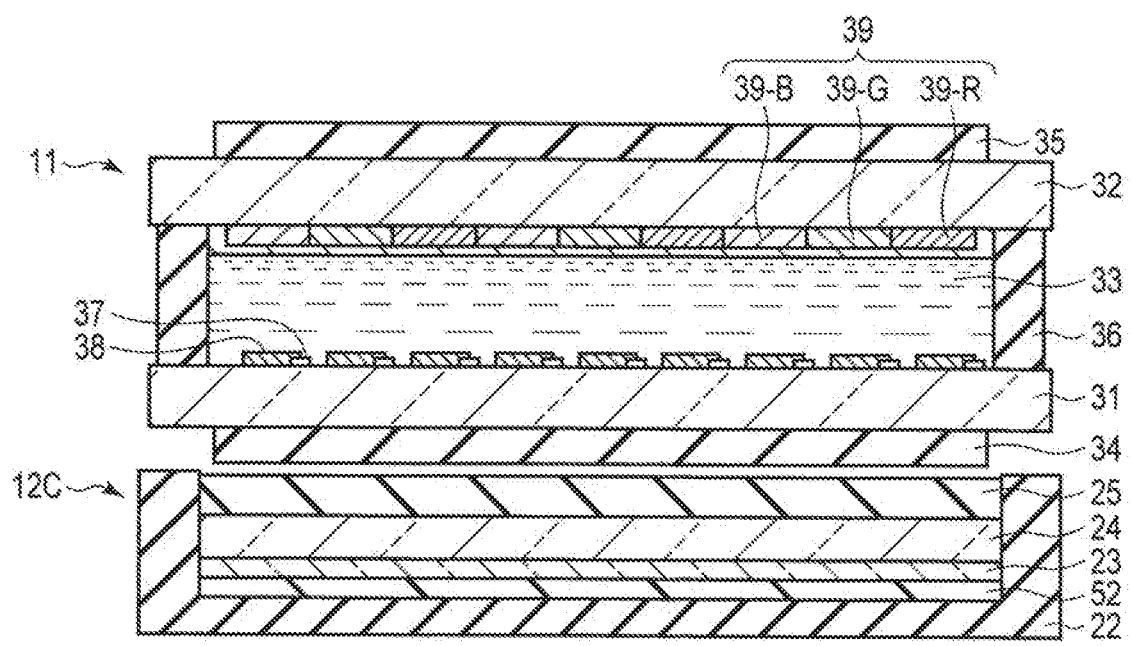
FIG. 13 is a cross-sectional view showing a configuration of a liquid crystal display device of a third embodiment.
Figure 14:
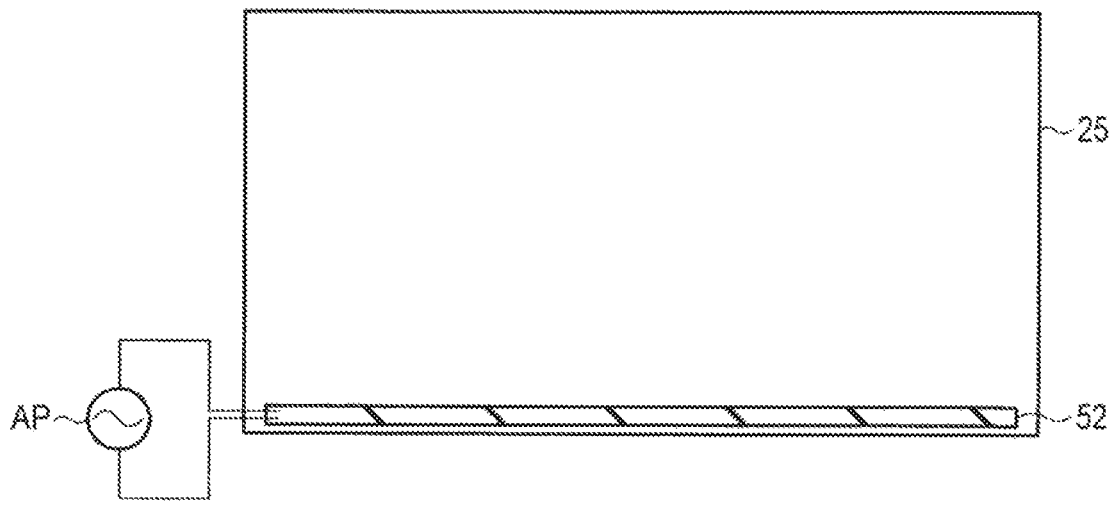
FIG. 14 is a plan view showing a positional relationship between a diffusion plate and a piezo film of a backlight unit in the third embodiment.

FIG. 13 is a cross-sectional view of the display panel and a backlight unit 12C in the third embodiment. FIG. 14 is a plan view showing a positional relationship between the diffusion plate 25 and a piezo film in the backlight unit 12C.

The backlight unit 12C is configured as follows. As shown in FIG. 13, a vibration generation unit, for example, a piezo film 52, the reflection plate 23, the light guide plate 24, and the diffusion plate 25 are arranged in this order on the backlight case 22. That is, the piezo film 52 is provided between the backlight case 22 and the reflection plate 23. As shown in FIG. 14, the piezo film 52 is arranged so as to overlap without contacting a part of the diffusion plate 25.

For example, when an AC voltage of 60 Hz is applied to the piezo film 52 by an AC power supply AP, displacement occurs in a piezoelectric element. Due to this displacement occurring in the piezo film 52, the diffusion plate 25 vibrates mainly in the direction crossing its main surface, for example, in a direction orthogonal to the main surface. Since the piezo film 52 is arranged between the backlight case 22 and the reflection plate 23, it may be opaque.

Figure 15:
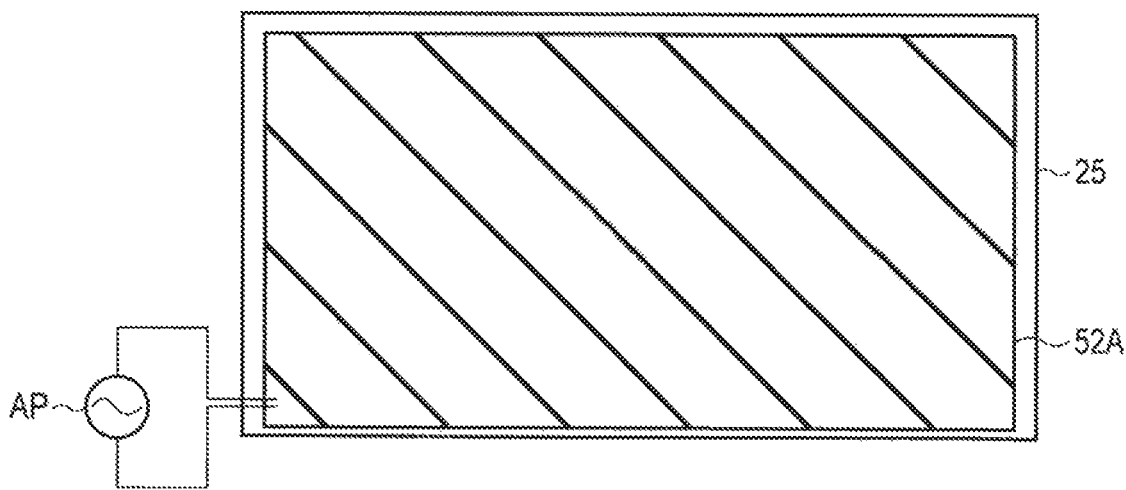
FIG. 15 is a plan view showing another example of the positional relationship between the diffusion plate and the piezo film of the backlight unit in the third embodiment.

FIG. 14 shows an example in which the piezo film 52 is arranged so as to overlap a part of the main surface of the diffusion plate 25, but the present invention is not limited to this. As shown in FIG. 15, a piezo film 52A may be arranged so as to almost entirely overlap the main surface of the diffusion plate 25.

[3-2] Operation of Liquid Crystal Display Device

When an image is displayed on the display panel 11, the control circuit 18 drives the piezo film 52 along with the display of the image. On the other hand, when the image of the display panel 11 is not displayed, the piezo film 52 is not driven along with the non-display of the image.

As described above, the piezo film 52 is arranged on a part of the backlight unit 12C, that is, between the backlight case 22 and the reflection plate 23. As the display on the display panel 11 is turned on by the control of the control circuit 18, the piezo film 52 generates vibration to vibrate the diffusion plate 25. Thus, the diffusion plate 25 vibrates mainly in the direction crossing its main surface.

[3-3] Effect of Third Embodiment

According to the liquid crystal display device of the present embodiment, it is possible to reduce speckle noise generated when laser light is used as illumination light, and to improve display performance.

Hereinafter, an effect of the present embodiment will be described in detail.

In the present embodiment, the diffusion plate 25 that emits laser light as illumination light is vibrated mainly in the direction crossing a main surface of the diffusion plate 25 (or in the optical path direction of the laser light) by the piezo film 52. That is, as described above, the piezo film 52 is arranged between the backlight case 22 and the reflection plate 23. Vibration generated from the piezo film 52 propagates to the diffusion plate 25. Thus, the diffusion plate 25 vibrates mainly in the direction crossing its main surface, for example, in a direction orthogonal to the main surface. As a result, by disturbing scattering of the laser light emitted from the diffusion plate 25, it is possible to reduce speckle noise generated due to interference of the laser light.

In addition, in the present embodiment, since the piezo film 52 is arranged between the backlight case 22 and the reflection plate 23, the opaque piezo film 52 can be used. Thus, various piezo films can be used, and the cost of the piezo film can be suppressed.

The present invention is not limited to the above-described embodiments, but can be embodied by modifying constituent elements without departing from the gist thereof. Furthermore, the above-described embodiments include inventions in various stages, and various inventions can be constituted by appropriately combining a plurality of structural elements disclosed in one embodiment or appropriately combining structural elements disclosed in different embodiments. For example, even if some structural elements are deleted from all the structural elements disclosed in the embodiments, in the case where the problem to be solved by the invention can be solved, and the effect of the invention can be obtained, an embodiment from which these structural elements are deleted can be extracted as an invention.

What is claimed is:

1. A liquid crystal display device comprising:
    a first substrate;
    a second substrate arranged on the first substrate;
    a liquid crystal layer provided between the first substrate and the second substrate;
    a switching element provided on the first substrate;
    a pixel electrode electrically connected to the switching element;
    a color filter provided on a liquid crystal side of the second substrate and that corresponds to the pixel electrode;
    a common electrode provided on a liquid crystal side of the color filter;
    a light guide plate including a side surface and a main surface and that guides laser light incident on the side surface, to emit the laser light from the main surface;
    a diffusion plate that diffuses the laser light emitted from the light guide plate, to apply the laser light to the first substrate;
    a supporting unit that supports the diffusion plate; and a vibration generation unit provided in the supporting unit and that vibrates the diffusion plate in an optical path direction of laser light from the diffusion plate.

2. The liquid crystal display device according to claim 1, wherein the vibration generation unit vibrates the diffusion plate in a direction crossing a main surface of the diffusion plate.

3. The liquid crystal display device according to claim 1, wherein the supporting unit includes a first surface in a direction crossing a main surface of the diffusion plate, and the vibration generation unit is mounted on the first surface.

4. The liquid crystal display device according to claim 3, wherein the vibration generation unit vibrates the first surface in a direction parallel to the first surface of the supporting unit.

5. The liquid crystal display device according to claim 1, wherein the vibration generation unit is a vibration motor including a vibrator on a rotation axis and that generates vibration by rotation of the rotation axis.

6. The liquid crystal display device according to claim 1, further comprising a control circuit that switches a display on a liquid crystal display panel to either an ON state or an OFF state, the liquid crystal display panel including the first substrate, the second substrate, the liquid crystal layer, the switching element, the pixel electrode, the color filter and the common electrode,
wherein the control circuit vibrates the vibration generation unit in accordance with switching the display of the liquid crystal display panel to the ON state.

7. A liquid crystal display device comprising:
a first substrate;
a second substrate arranged on the first substrate;
a liquid crystal layer provided between the first substrate and the second substrate;
a switching element provided on the first substrate;
a pixel electrode electrically connected to the switching element;
a color filter provided on a liquid crystal side of the second substrate and that corresponds to the pixel electrode;
a common electrode provided on a liquid crystal side of the color filter;
a light guide plate including a side surface and a main surface and that guides laser light incident on the side surface, to emit the laser light from the main surface;
a diffusion plate that diffuses the laser light emitted from the light guide plate, to apply the laser light to the first substrate;
a vibration generation unit that vibrates the diffusion plate in an optical path direction of laser light from the diffusion plate; and
a supporting unit that supports the light guide plate, the diffusion plate, and the vibration generation unit.

8. The liquid crystal display device according to claim 7, wherein the vibration generation unit is arranged between the light guide plate and the diffusion plate.

9. The liquid crystal display device according to claim 8, wherein the vibration generation unit is in contact with a part of the diffusion plate.

10. The liquid crystal display device according to claim 8, wherein the vibration generation unit is in contact with a main surface of the diffusion plate.

11. The liquid crystal display device according to claim 7, further comprising a reflection plate arranged between the supporting unit and the light guide plate and that reflects the laser light emitted from the light guide plate,
wherein the vibration generation unit is arranged between the supporting unit and the reflection plate.

12. The liquid crystal display device according to claim 11, wherein the vibration generation unit is in contact with a part of the reflection plate.

13. The liquid crystal display device according to claim 11, wherein the vibration generation unit is in contact with a main surface of the reflection plate.

14. The liquid crystal display device according to claim 7, wherein the vibration generation unit is a piezo film in which displacement occurs by a voltage being applied.

* * * * *